United States Patent
Liu et al.

(10) Patent No.: US 7,254,759 B2
(45) Date of Patent: Aug. 7, 2007

(54) METHODS AND SYSTEMS FOR SEMICONDUCTOR DEFECT DETECTION

(75) Inventors: Tong-Yu Liu, Changhua County (TW); Yen-Sheng Chang, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 164 days.

(21) Appl. No.: 11/203,236

(22) Filed: Aug. 15, 2005

(65) Prior Publication Data

US 2006/0143550 A1    Jun. 29, 2006

(30) Foreign Application Priority Data

Dec. 29, 2004    (TW) ................. 93141168 A

(51) Int. Cl.
  *G01R 31/28* (2006.01)
  *G11F 29/00* (2006.01)
  *G06F 7/02* (2006.01)

(52) U.S. Cl. ............... 714/725; 714/733; 714/819; 714/723

(58) Field of Classification Search .......... None
  See application file for complete search history.

(56) References Cited

U.S. PATENT DOCUMENTS

| 4,266,294 | A * | 5/1981 | Daughton et al. | 714/735 |
| 5,760,892 | A * | 6/1998 | Koyama | 356/237.1 |
| 5,828,778 | A * | 10/1998 | Hagi et al. | 382/145 |
| 6,477,685 | B1 * | 11/2002 | Lovelace | 716/4 |
| 7,137,055 | B2 * | 11/2006 | Hirano et al. | 714/738 |

* cited by examiner

*Primary Examiner*—Phung My Chung
(74) *Attorney, Agent, or Firm*—Birch, Stewart, Kolasch & Birch, LLP

(57) ABSTRACT

A method for semiconductor defect detection, applied to a wafer test in a semiconductor process. A defect test is implemented for generating redundant information. an abnormal test implemented for generating a first FBM. The redundant information is converted to a second FBM. The first and second FBMs are compared, thereby generating a third FBM according to comparison results.

12 Claims, 5 Drawing Sheets

METHODS AND SYSTEMS FOR SEMICONDUCTOR DEFECT DETECTION

BACKGROUND

The invention relates to defect detecting methods, and more particularly, to methods for wafer defect detection based on fail bit maps (MAP).

Semiconductor processes comprise integrated circuit (IC) designs, wafer fabrications, wafer probe tests, and wafer packaging. A wafer probe test probes each grain on a chip for testing electric characteristics. Failed grains are marked and discarded for preventing from increasing production cost.

The wafer probe test mainly locates defects on a chip. Conventionally, the wafer probe test implements tests related to electrical characteristics to all memory cells (disposed as a matrix) on a chip, displaying coordinates of failed memory cells in the form of fail bit mapping (FBM), according to test results, in a coordinate region defined by the X and Y axes, and estimating failed reasons according to analyzed FBM types, such as point-failed, block-failed, or line-failed. The fail bit mapping is an abnormal analysis method for semiconductor components, visualizing addresses of abnormal memory cells for confirmations.

Defect detections may be performed after wafer probe test are complete, raising yield rates of chips. FBM tests, for example, are first implemented, and defect detections, such as working voltage tests, wafer level burn-in (WLBI) tests, function tests, and the like, are then implemented. WLBI tests consider the decrease of production cost beforehand during the design stage. Reliability verification, for example, is considered in circuit design, such that a WLBI mode is involved to implement reliability verification to products in the wafer test stage and the products may not be burned after a package process, thereby decreasing package and finished product test costs.

The WLBI process can find failed bits on each chip and analyzes the chips with a greater number of failed bits for failed reasons. The WLBI process, however, may not discover failed bits each time. Some failed bits temporarily exist and each preformed defect test process may generate failed bits, such that it is difficult to determine which failed bit is produced at in which process. As described above, current solutions execute a FBM test again after all desired defect tests are complete. Thus, location information corresponding to failed bits is obtained in a last FBM test, and the current FBM test further verifies the location information.

The described solution, however, requires to perform a FBM test twice and further involves a WLBI test, spending and decreasing production capacity accordingly. Additionally, the described solution cannot accurately obtain location information of produced failed bits corresponding to each defect test. Thus, an improved method for locating failed bits is desirable, saving test time, raising product yield rates, and maintaining production capacity.

SUMMARY

Systems for semiconductor defect detection, applied to abnormal analysis for a semiconductor component are provided. An embodiment of such a system comprises an abnormal test unit, a converting unit, and a comparison unit. The abnormal test unit implements an abnormal test to the semiconductor component for generating a first fail bit map (FBM). The converting unit converts redundant information generated through a defect test to a second FBM. The comparison unit compares the first and second FBMs, thereby generating a third FBM according to comparison results.

Also disclosed are methods for semiconductor defect detection, applied to a wafer test in a semiconductor process. In an embodiment of such a method, a defect test is implemented for generating redundant information. an abnormal test implemented for generating a first FBM. The redundant information is converted to a second FBM. The first and second FBMs are compared, thereby generating a third FBM according to comparison results.

Further disclosed is a semiconductor process implementing a wafer test process, the process applied to abnormal analysis for a semiconductor component using a method for semiconductor defect detection. In an embodiment of such a method, a defect test is implemented for generating redundant information an abnormal test implemented for generating a first FBM. The redundant information is converted to a second FBM. The first and second FBMs are compared, thereby generating a third FBM according to comparison results.

BRIEF DESCRIPTION OF THE DRAWINGS

The present invention can be more fully understood by reading the subsequent detailed description and examples of embodiments thereof with reference made to the accompanying drawings, wherein.

DETAILED DESCRIPTION

Embodiments of the invention disclose a method and system for semiconductor defect detection using failed bit mapping (FBM).

Several exemplary embodiments of the invention will now be described with reference to FIGS. 1 through 5, which generally relate to semiconductor defect detection. While some embodiments of the invention operate with the defect detection processes, it is understood that the article patterned by the detection processes is not critical, and other detection processes patterning an article according to defects of a semiconductor component may be readily substituted.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the Figures corresponds to the Figure number, with the exception that the same reference number is used throughout to refer to an identical component which appears in multiple Figures.

Figure 1:
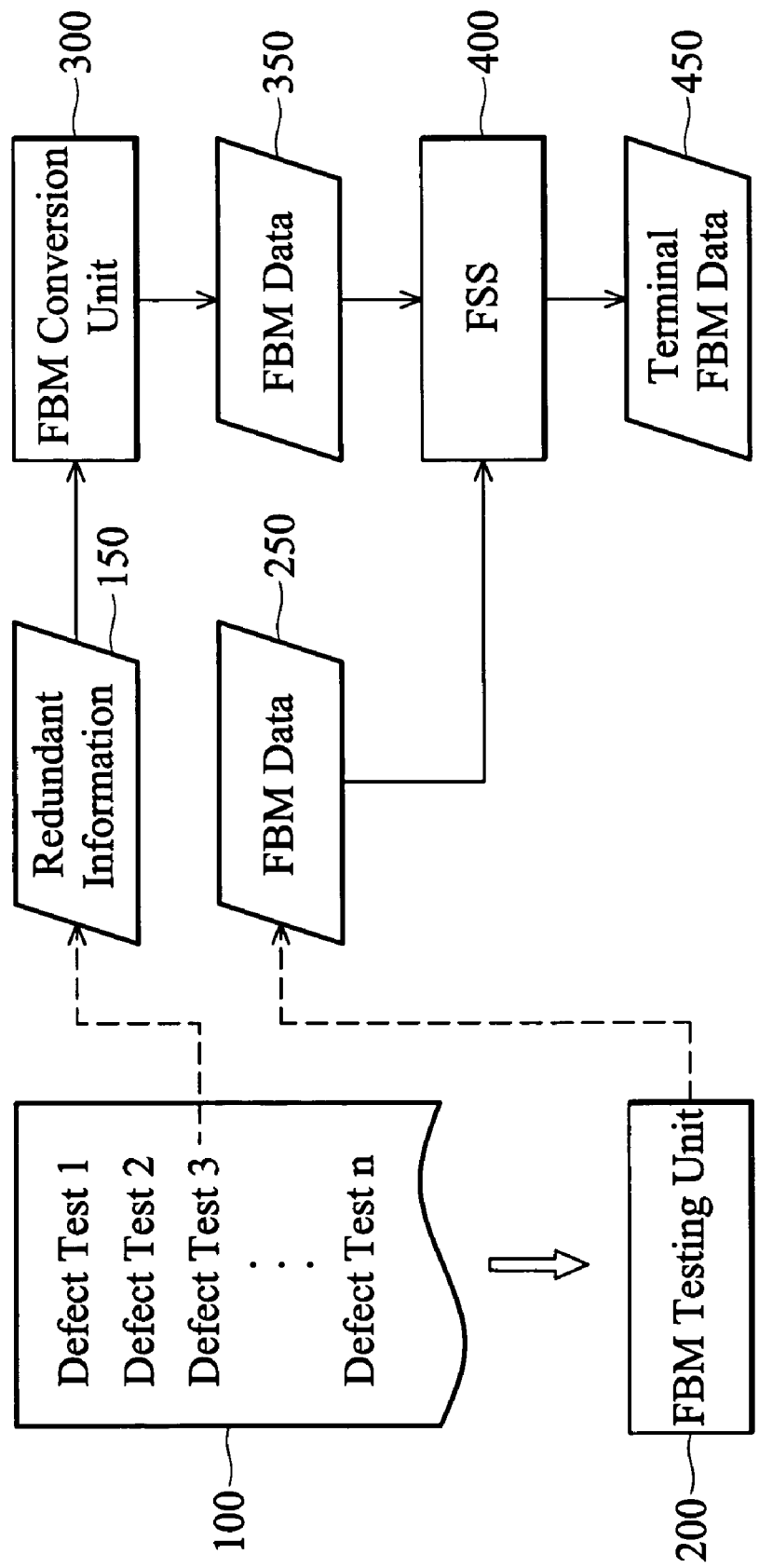
FIG. 1 is a schematic view of an embodiment of a system for semiconductor defect detection.

FIG. 1 is a schematic view of an embodiment of a system for semiconductor defect detection.

A system of an embodiment of the invention comprises a FBM converting unit 300 and a failure-mode summarized system (FSS) 400. FBM converting unit 300 converting redundant information generated through a defect test to FBM data for comparison. FSS 400 compares the FBM data converted from the redundant information and the FBM data generated by a FBM test.

Referring to FIG. 1, defect tests 100 (defect test 1~n) at least one defect test is implemented to a chip for finding additional failed bits. To locate failed bits produced by one of defect tests for reporting to the system of the invention for analyzing defective rates, desired failed bit data produced by the defect tests is stored as redundant information 150. As all the defect tests are complete, FBM test unit 200 implements a FBM test, and FBM data (i.e. fail bit mapping) 250 is thus generated after the FBM test is complete. FBM data 250 comprises failed bits before and after defect tests 100 are implemented.

Figure 2:
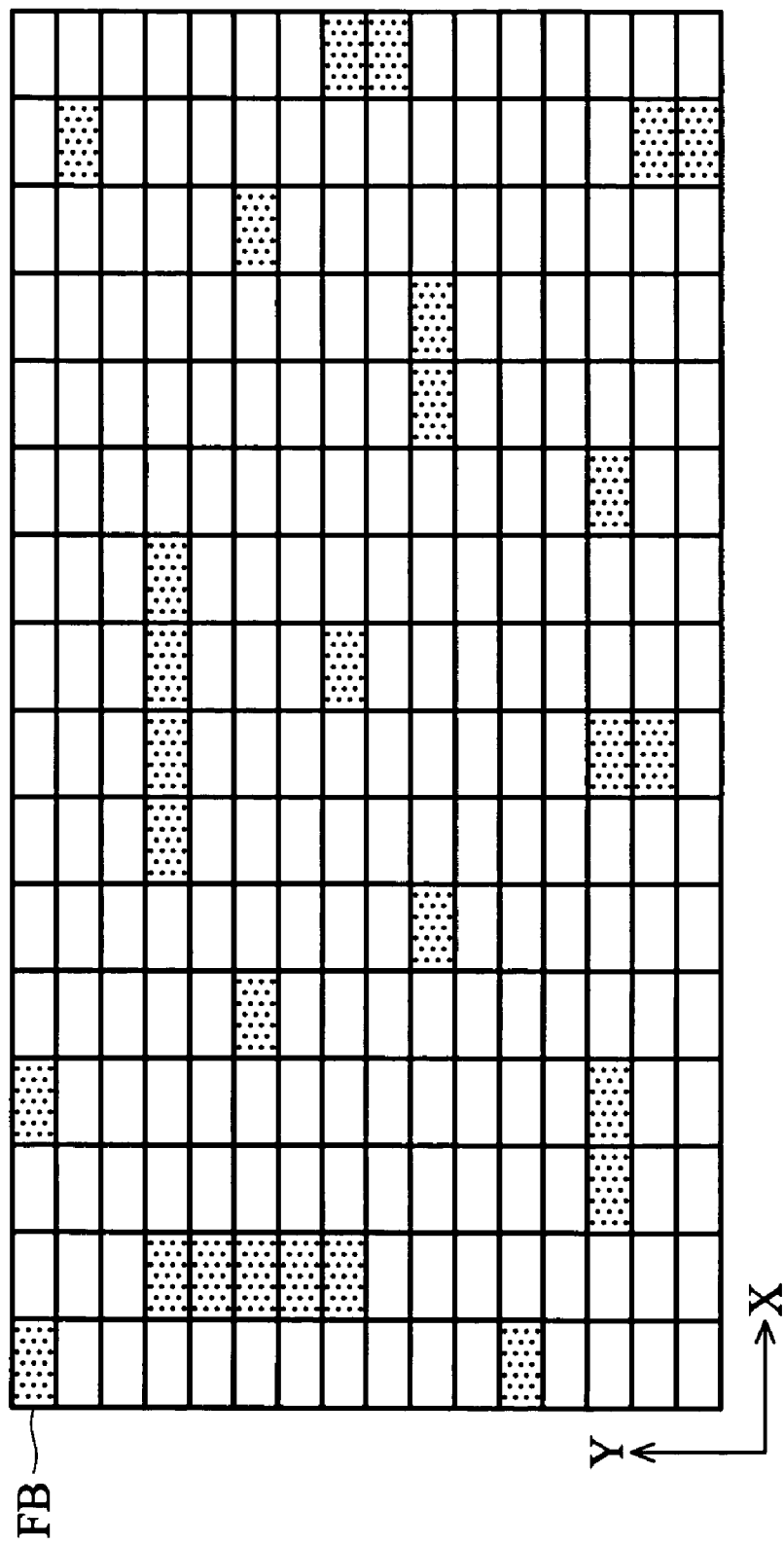
FIG. 2 is a schematic view of an embodiment of a FBM generated through a FBM test.

Referring to FIG. 2, a chip is represented as a 16×16 bit map matrix, in which failed bits included in FBM data 250 produced by the FBM test are represented as doted matrix cells. Next, referring to FIG. 3, as described above, the failed bit data produced by the defect tests is stored as redundant information (restore information) 150, and redundant information 150 is converted to FBM data (i.e. fail bit mapping) 350 using FBM converting unit 300 as shown in FIG. 1. Similarly, failed bits included in FBM data 350 are represented as cross-hatching matrix cells.

Figure 4:
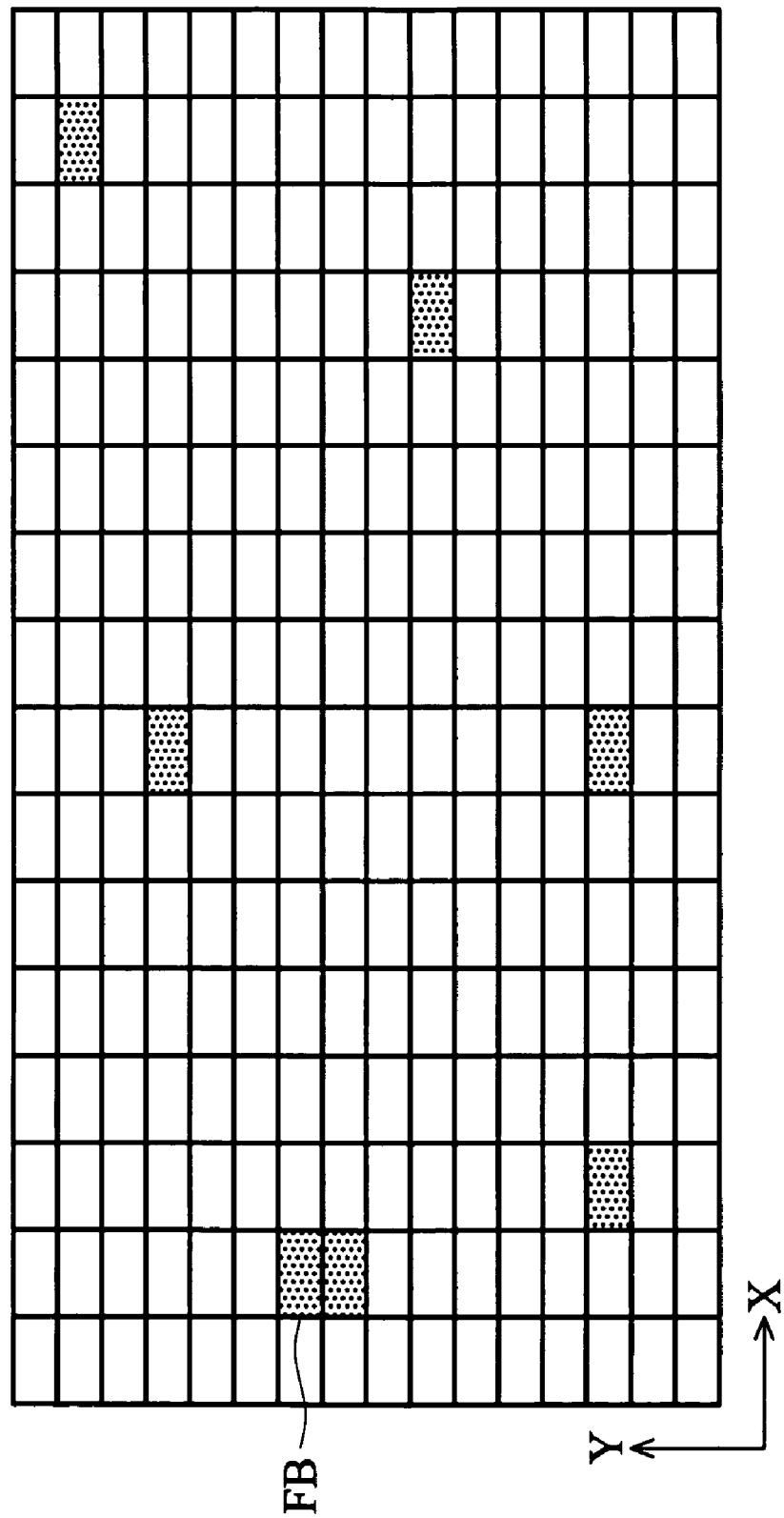
FIG. 4 is a schematic view of an embodiment of a failed bit map according to the FBMs shown in FIGS. 2 and 3.

Next, FSS 400 shown in FIG. 1 compares FBM data 250 and FBM data 350 for obtaining failed bit data produced by the defect tests. FSS 400 compares locations of failed bits (involved in FBM data 250 and 350) corresponding to a XY-plane, and, when a location of a failed bit corresponds to the same location in FBM data 250 and 350, respectively, based on the XY-plane, the failed bit is desired in the embodiment of the invention. Referring to FIG. 4, failed bits simultaneously located at the same locations respectively are saved, thus obtaining FBM data 450 (i.e. fail bit mapping), in which failed bits are represented as doted matrix cells.

Figure 5:
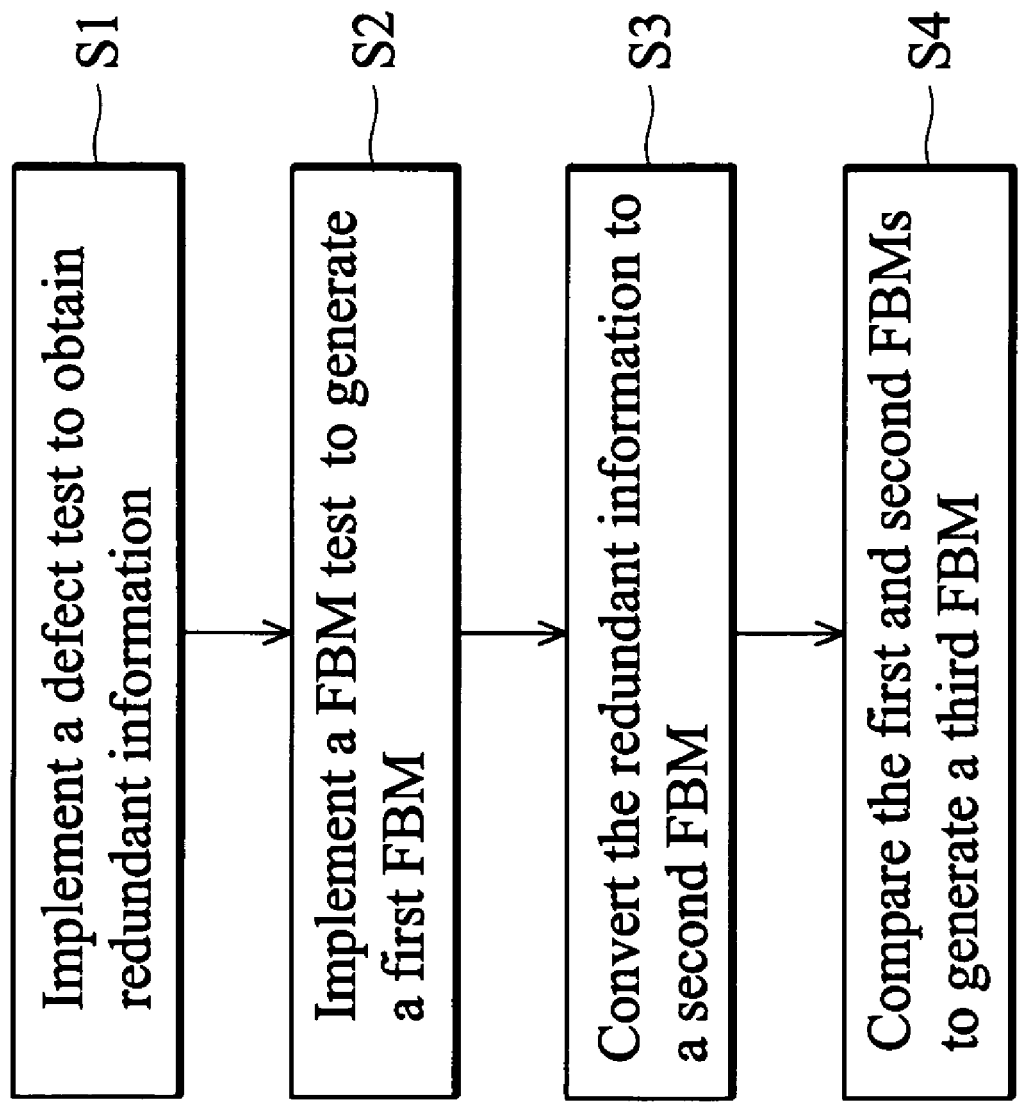
FIG. 5 is a flowchart of an embodiment of a method for semiconductor defect detection.

FIG. 5 is a flowchart of an embodiment of a method for semiconductor defect detection.

In step S1, a defect test is implemented for obtaining failed bit data, stored as redundant information.

In step S2, a FBM test is implemented for obtaining failed bit data, thereby generating a first FBM. The first FBM is an N×N matrix comprising a plurality of failed bits, as shown in FIG. 2.

Figure 3:
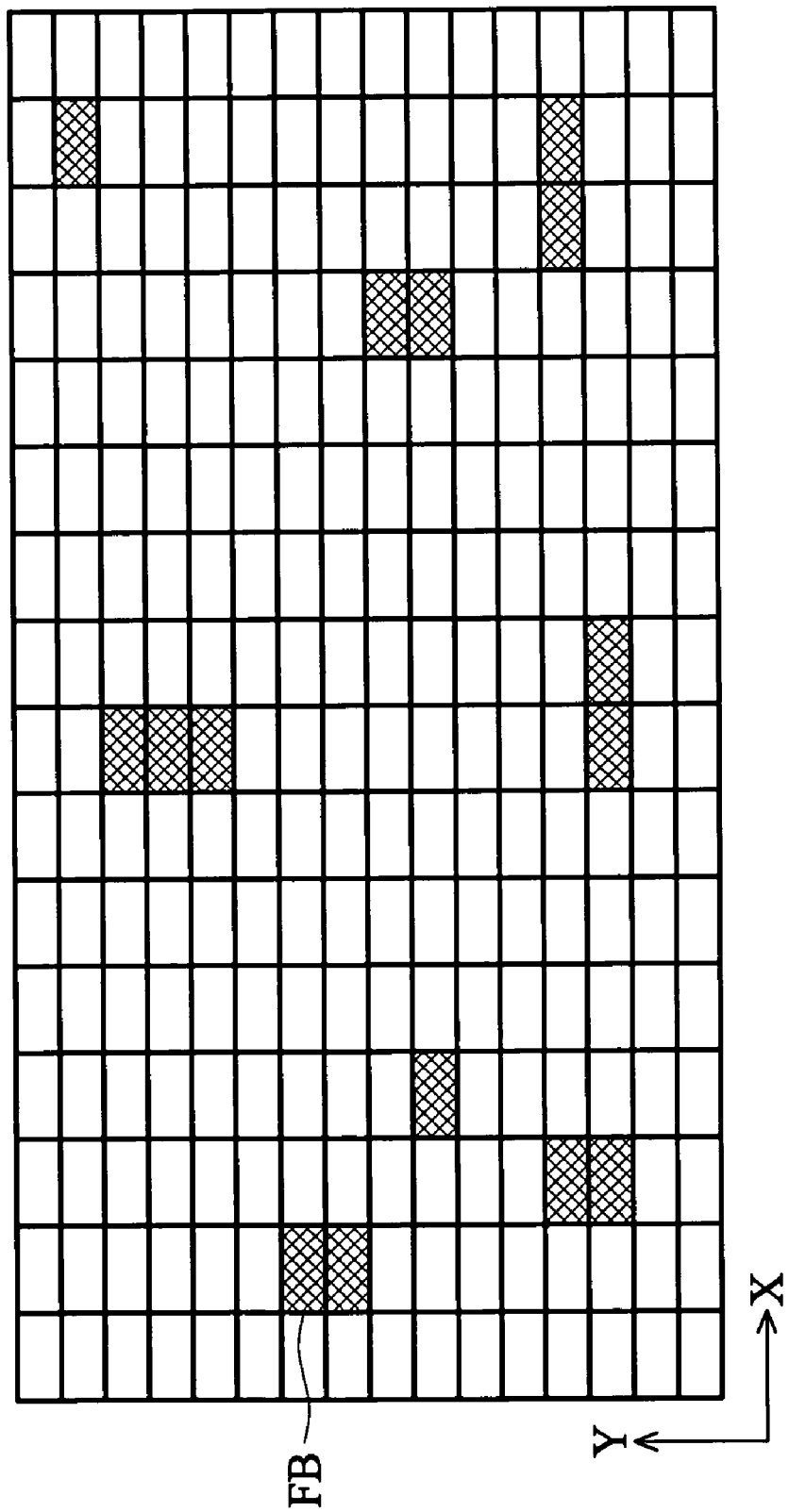
FIG. 3 is a schematic view of an embodiment of a FBM generated by converting redundant information.

In step S3, the redundant information is converted to a second FBM, which is an N×N matrix and a plurality of failed bits, as shown in FIG. 3.

In step S4, the first and second FBMs are compared, thereby generating a third FBM according to comparison results. The third FBM is an N×N matrix comprising a plurality of failed bits located at corresponding positions in the first and second FBMs based on the XY-plane, as shown in FIG. 4.

The method of an embodiment of the invention obtains related wafer defect data when defect tests are implemented. The wafer defect data is compared with a FBM generated through a FBM test, reporting failed bit data for reliability verification, thereby saving test time, raising product yield rates, and maintaining production capacity.

Although the present invention has been described in preferred embodiment, it is not intended to limit the invention thereto. Those skilled in this technology can still make various alterations and modifications without departing from the scope and spirit of this invention. Therefore, the scope of the present invention shall be defined and protected by the following claims and their equivalents.

What is claimed is:

1. A system for semiconductor defect detection, applied to abnormal analysis for a semiconductor component, comprising:
   an abnormal test unit, implementing an abnormal test to the semiconductor component for generating a first fail bit map (FBM);
   a converting unit, converting redundant information generated through a defect test to a second FBM; and
   a comparison unit, comparing the first and second FBMs for generating a third FBM.

2. The system as claimed in claim 1, wherein the first FBM is an N×N matrix comprising a plurality of failed bits.

3. The system as claimed in claim 2, wherein the second FBM is an N×N matrix comprising a plurality of failed bits.

4. The system as claimed in claim 3, wherein the third FBM is an N×N matrix comprising a plurality of failed bits located at corresponding positions in the first and second FBMs based on the XY-plane.

5. A method for semiconductor defect detection, applied to a wafer test in a semiconductor process, comprising:
   implementing a defect test for generating redundant information;
   implementing an abnormal test for generating a first FBM;
   converting the redundant information to a second FBM; and
   comparing the first and second FBMs for generating a third FBM.

6. The method as claimed in claim 5, wherein the first FBM is an N×N matrix comprising a plurality of failed bits.

7. The method as claimed in claim 6, wherein the second FBM is an N×N matrix comprising a plurality of failed bits.

8. The method as claimed in claim 7, wherein the third FBM is an N×N matrix comprising a plurality of failed bits located at corresponding positions in the first and second FBMs based on the XY-plane.

9. A semiconductor process implementing a wafer test process, the wafer test process applied to abnormal analysis for a semiconductor component using a method for semiconductor defect detection, the method comprising:
   implementing a defect test for generating redundant information;
   implementing an abnormal test for generating a first FBM;
   converting the redundant information to a second FBM; and
   comparing the first and second FBMs for generating a third FBM.

10. The semiconductor process as claimed in claim 9, wherein the first FBM isan N×N matrix comprising a plurality of failed bits.

11. The semiconductor process as claimed in claim 10, wherein the second FBM is an N×N matrix comprising a plurality of failed bits.

12. The semiconductor process as claimed in claim 11, wherein the third. FBM is an N×N matrix comprising a plurality of failed bits located at corresponding positions in the first and second FBMs based on the XY-plane.

* * * * *